United States Patent [19]
Boden, Jr. et al.

[11] Patent Number: 6,165,821
[45] Date of Patent: *Dec. 26, 2000

[54] P CHANNEL RADHARD DEVICE WITH BORON DIFFUSED P-TYPE POLYSILICON GATE

[75] Inventors: Milton J. Boden, Jr., Redondo Beach; Yuan Xu, El Segundo, both of Calif.

[73] Assignee: International Rectifier Corp., El Segundo, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/020,837

[22] Filed: Feb. 9, 1998

[51] Int. Cl.$^7$ .................................................. H01L 21/332
[52] U.S. Cl. ........................... 438/137; 438/268; 438/273
[58] Field of Search ..................... 257/335, 329; 438/286, 135, 268, 273, 161, 137, 173, 157, 138, 156, FOR 176, FOR 192

[56] References Cited

U.S. PATENT DOCUMENTS

| | | |
|---|---|---|
| 4,680,853 | 7/1987 | Lidow et al. ............................. 438/268 |
| 4,785,344 | 11/1988 | Franz ...................................... 257/335 |
| 5,055,895 | 10/1991 | Akiyama et al. ........................ 257/335 |
| 5,091,336 | 2/1992 | Beason .................................... 438/135 |
| 5,248,627 | 9/1993 | Williams ................................. 438/268 |
| 5,288,653 | 2/1994 | Enjoh ...................................... 438/273 |
| 5,338,693 | 8/1994 | Kinzer et al. ............................ 438/268 |
| 5,374,571 | 12/1994 | Mukherjee et al. ..................... 428/273 |
| 5,475,252 | 12/1995 | Merrill et al. ........................... 257/341 |
| 5,479,037 | 12/1995 | Hshieh et al. ........................... 257/335 |

*Primary Examiner*—Olik Chaudhuri
*Assistant Examiner*—William David Coleman
*Attorney, Agent, or Firm*—Ostrolenk, Faber, Gerb & Soffen, LLP

[57] ABSTRACT

A MOS gated device is resistant to both high radiation and SEE environments. Spaced, N-type body regions are formed in the surface of a P-type substrate of a semiconductor wafer. P-type dopants are introduced into the surface within each of the channel regions to form respective source regions therein. The periphery of each of the source regions is spaced from the periphery of its respective channel region at the surface to define N-type channel regions between the spaced peripheries. A layer of gate oxide is formed over the channel areas. A doped polysilicon gate electrode is formed atop the gate oxide. A source electrode is formed atop the source regions. The MOS gated device is optimized to maintain a threshold voltage of between –2V to –5V for a total irradiation dose of 300 Krad while maintaining SEE withstand capability.

18 Claims, 9 Drawing Sheets

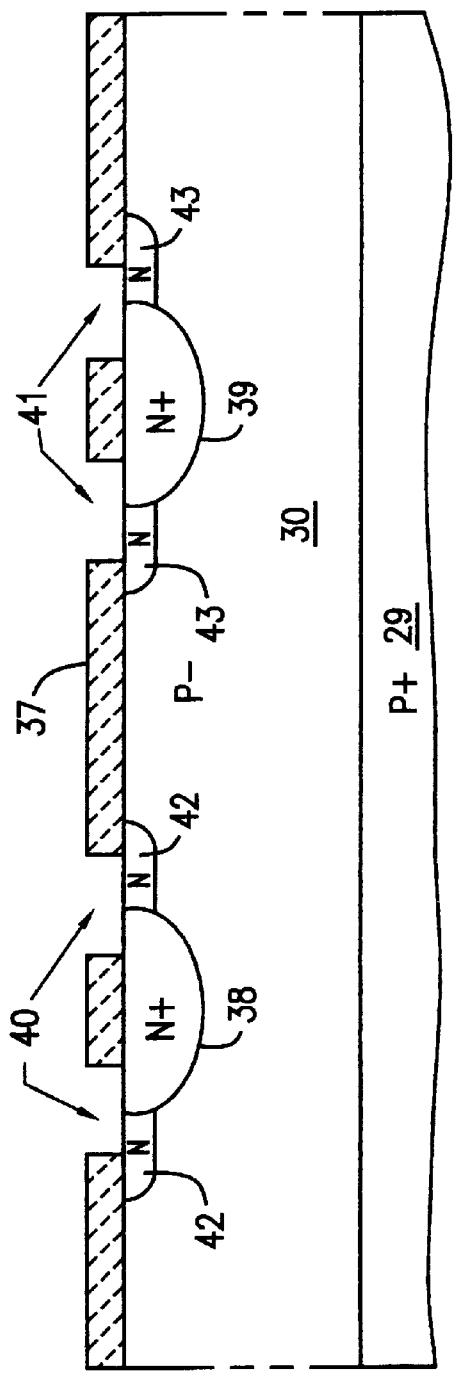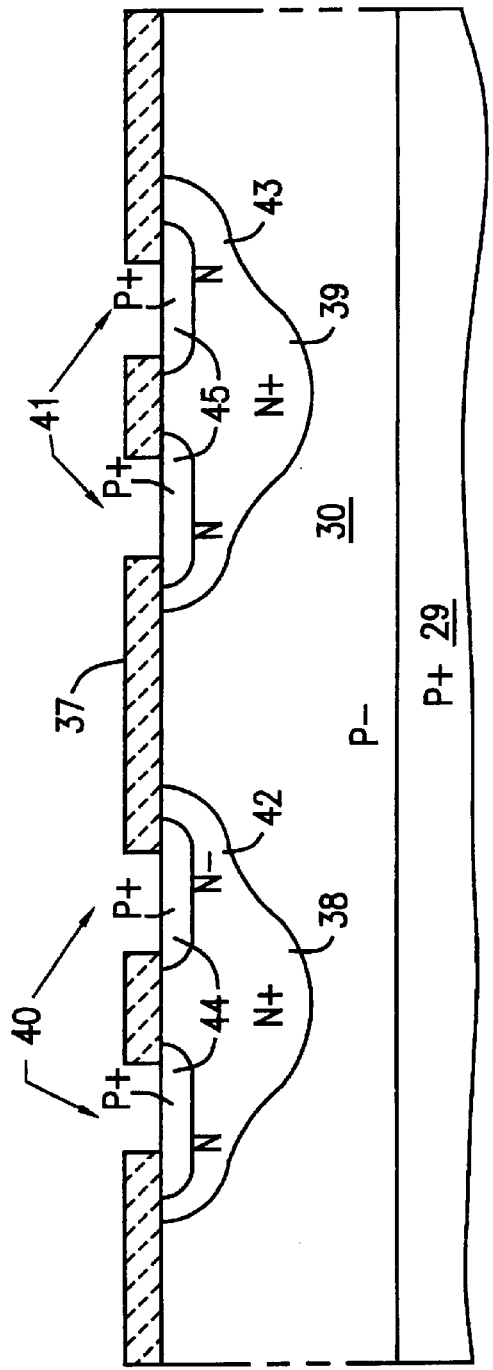

P CHANNEL RADHARD DEVICE WITH BORON DIFFUSED P-TYPE POLYSILICON GATE

RELATED APPLICATIONS

This application is related to U.S. Pat. No. 5,475,252, issued Dec. 12, 1995, (IR-914[Cont]) in the name of Perry Merrill and Kyle A. Spring, entitled PROCESS FOR MANUFACTURE OF RADIATION RESISTANT POWER MOSFET AND RADIATION RESISTANT POWER MOSFET and assigned to the assignee of the present invention.

FIELD OF THE INVENTION

This invention relates to radiation hardened ("radhard") MOS gated devices which have improved resistance to damage by large (megarad) doses of ionizing radiation, or by single or plural event high energy charged particles ("SEE" particles).

BACKGROUND OF THE INVENTION

Electronic devices that are used in high radiation environments, such as in outer space, are subject to many forms of radiation. The effects of ionizing radiation can accumulate over time, resulting in device degradation. Also, heavy ion strikes can lead ted catastrophic failure. When power devices are employed in such environments, the devices are typically more susceptible to these problems because of their large depletion volumes and large device areas.

Radiation hardened power MOSFETS, and other MOS gated devices designed for use in space or other high radiation ambients, have the conflicting design requirements of resisting damage caused by high doses of ionizing radiation on the one hand and of resisting damage caused by even single event high energy charged particles ("SEE") on the other. Thus, a thin gate oxide is desired to resist high radiation (megarad) environments, while a relatively thick gate oxide is desired to resist SEE effects.

More specifically, it is known that after exposure to a large total dose of ionizing radiation a positive charge will build up in the gate oxide to change the device threshold voltage. Further, there is an increase of interface traps at the silicon/gate oxide boundary. Both of these effects are reduced by using at thinner gate oxide, for example, one having a thickness of less than about 900 Å.

Devices used in a high radiation environment, such as in outer space, are also subject to damage or failure if struck by even a single high energy charged particle. Such charged particles pass into or through the silicon and generate a large number of electron-hole pairs in the depletion region of the device. Some of these charges collect on the gate oxide, resulting in a high potential across the gate oxide. Thus, a thicker gate oxide, for example, one thicker than about 1300 Å is desired to resist SEE failure.

Because of these diverse requirements, different manufacturing processes are used for a "megarad" product designed for use in a high total radiation dose environment and an SEE product which is optimized for single particle effects.

In the known vertical conduction, multi-cellular MOSFET products, the charge collection at the oxide interface is in the drift region between cells. The device voltage is set in the charge in the inversion region. Thus, a design trade-off is necessary to set the gate oxide thickness for either a thin gate oxide for good total dose resistance or relatively thicker gate oxide for good SEE resistance.

It is also known that the P channel power MOSFET devices have demonstrated less susceptibility to SEE effects compared to N channel devices. G. H. Johnson, J. H. Hohl, R. D. Schrimpf and K. F. Galloway, "Simulating Single-Event Burnout in Vertical Power MOSFETs," IEEE Trans. Electron Devices, vol. 40 pp. 1001–1008, 1993. However, the threshold of P channel devices changes more rapidly with increasing total dose since both the accumulated oxide charge and interface traps cause the threshold to become more negative.

Furthermore, as noted above, optimizing the P-channel device to provide both SEE resistance and total radiation dose resistance requires significant trade offs. Typically, the threshold voltage shift is a monotonic function of the total radiation dose because the oxide charges and the interface traps make the threshold voltage more negative. As a result, the starting threshold voltage may need to be controlled to as near to −2V as possible. Further, the gate oxide should be kept as thin as possible to minimize positive charge buildup in the oxide. However, these requirements make the device more susceptible to single event gate rupture (SEGR) because of the thinner oxide. Also, the threshold voltage is typically a function of both the channel dopant density and the gate oxide thickness. When the channel doping level is too low, gain of the parasitic bipolar transistor increases, thereby increasing the risk of single event burnout. Therefore, total radiation dose protection capability favors incorporating thinner gate oxides and lower channel doping whereas the desire for SEE protection requires thicker gate oxides and higher channel doping.

It is thus further desirable to have a radiation hardened, P channel device that is optimized to maintain a predetermined threshold voltage at a high total irradiation dose while maintaining single event withstand capability.

BRIEF DESCRIPTION OF THE INVENTION

In accordance with the present invention a P channel MOS gated device (a power MOSFET, IGBT, GTO or other device employing an MOS gate) is optimized to have both total radiation dose resistance and SEE resistance.

According to an aspect of the invention, an MOS gated device is resistant to single event radiation and to total dose radiation. A P-type substrate has substantially flat parallel upper and lower surfaces. Laterally spaced N-type body and channel regions extend from the upper surface of the substrate. A respective P-type source region for each of the channel regions extends from the upper surface into their respective channel region at a depth less than the depth of the respective channel regions. A gate oxide layer overlies the channel regions. A gate electrode is disposed atop the gate oxide and is insulated from the spaced channel regions and operates to invert the spaced channel regions in response to the application of a suitable gate voltage to the gate electrode. The gate electrode is comprised of P-type polysilicon. A source electrode is disposed atop the first surface and is connected to each of the source regions.

According to this aspect of the invention, the gate electrode may be silicon dioxide and may have a thickness which is less than 1000 Å. The N-type channel region may be formed by a 100 KeV phosphorus implant at a dose of between 5.5E13 and 8.0E13. The gate electrode may have a doping concentration roughly corresponding to a 50 KeV boron implant dose of 5E15.

According to another aspect of the invention, a power MOSFET having improved total dose radiation resistance and single event further resistance is formed.

According to this aspect of the invention, the gate oxide may be formed by a pyrogenic process. The gate oxide may be annealed after its formation and may have a thickness of about 500 to 1000 Å. The N-type channel region may be formed by a phosphorus implant at, a dose of about 7.0E13.

The radhard P-channel device maintains a threshold voltage of between −2V to −5V at a total irradiation dose of 300 Krad while maintaining SEE withstand capability.

BRIEF DESCRIPTION OF THE DRAWINGS

FIG. 7 shows the chip of FIG. 6 in which phosphorus were implanted and driven in through the opened window to form channel regions.

FIG. 8 shows the chip of FIG. 7 after the implantation of boron and an anneal step to form source regions.

DETAILED DESCRIPTION OF THE DRAWINGS

The Figures show the manner in which a P channel MOS gated device, in particular, a MOSFET can be manufactured in accordance with the invention. The process flow disclosed is similar to that described in U.S. Pat. Nos. 5,338,693 and 5,475,252. However, other process flows can be used.

Figure 1:
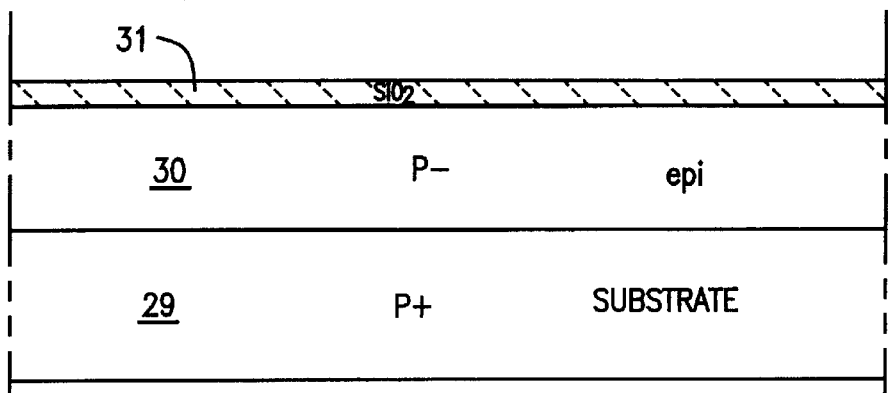
FIG. 1 is a cross-section of a chip of silicon which is to be processed in accordance with the invention and is shown after the growth of a field oxide.

Referring first to FIG. 1, there is shown a portion of a wafer of monocrystalline silicon 29 having an N-type epitaxially deposited layer 30 thereon. In the usual fashion, a large number of identical devices will be fabricated in a common wafer which is later diced to produce individual devices which are appropriately housed. The epitaxial layer 30 may have a resistivity of 4.5–5.5 ohm/cm, for example, for the manufacture of power MOSFET device having a reverse breakdown voltage of 100 to 150 volts. A higher resistivity is used for higher voltage devices.

The first step of the process shown in FIG. 1 is the formation of a field oxide layer 31 having a thickness of about 7500 Å, for example. Any standard oxide growing process may be used.

Figure 2:
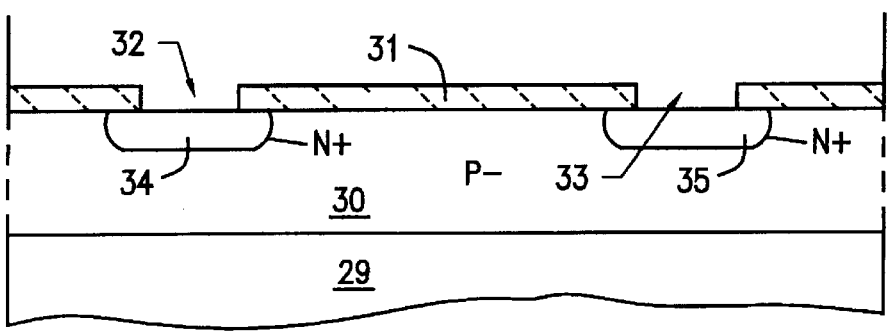
FIG. 2 shows the chip of FIG. 1 after a first mask operation and the ion implantation of a dose of phosphorus.

Then, a first mask is applied to the surface of the oxide layer 31 and an oxide etch is carried out in oxide layer 31 to form openings to the body regions of the cells, shown as openings 32 and 33 in FIG. 2. The oxide etch also forms openings in the oxide layer to the gate bus region as well as to the source and gate bond pad areas (not shown).

After the openings 32 and 33 have been formed, a phosphorus ion implant is carried out in which ions are implanted through the openings 32 and 33 to form shallow N+ regions 34 and 35, respectively. The ion implant step is carried out at an energy of approximately 120 KeV at a dose of about 3.0E15, for example.

Figure 3:
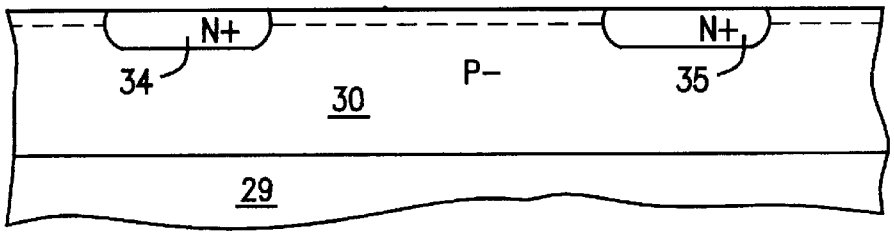
FIG. 3 shows the chip of FIG. 2 after a second mask operation, the etching of the field oxide and the ion implantation of a dose of boron.

Thereafter, a second mask is applied, and a further oxide etch is carried out in which a part of the remaining portion of oxide layer 31 is removed from the active areas of the chip but is left in the termination regions (not shown). A boron ion implant step is then carried out at an energy of roughly 120 KeV and at a dose of about 1E12, for example. The boron implant reduces the JFET resistance and forms an enhanced P- layer 36, shown in FIG. 3. A screening oxide layer may be grown in the device areas prior to the enhancement implant.

Figure 4:
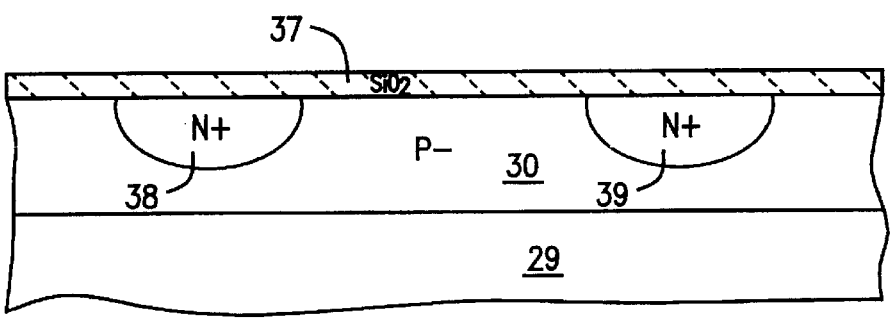
FIG. 4 shows the chip of FIG. 3 after the growth of another oxide layer and the drive in of the phosphorus ions to form N-type regions.

Then, the body and enhancement dopant ions are driven in and, preferably at the same time, a layer 37 of about 4500 Å, for example, of silicon dioxide is grown. The junction depth of the N+ body regions, and the N+ body diode, grows to form regions 38 and 39 shown in FIG. 4. The depth of the enhancement region 36 also increases but does not form a junction and is therefore not shown herein.

Figure 5:
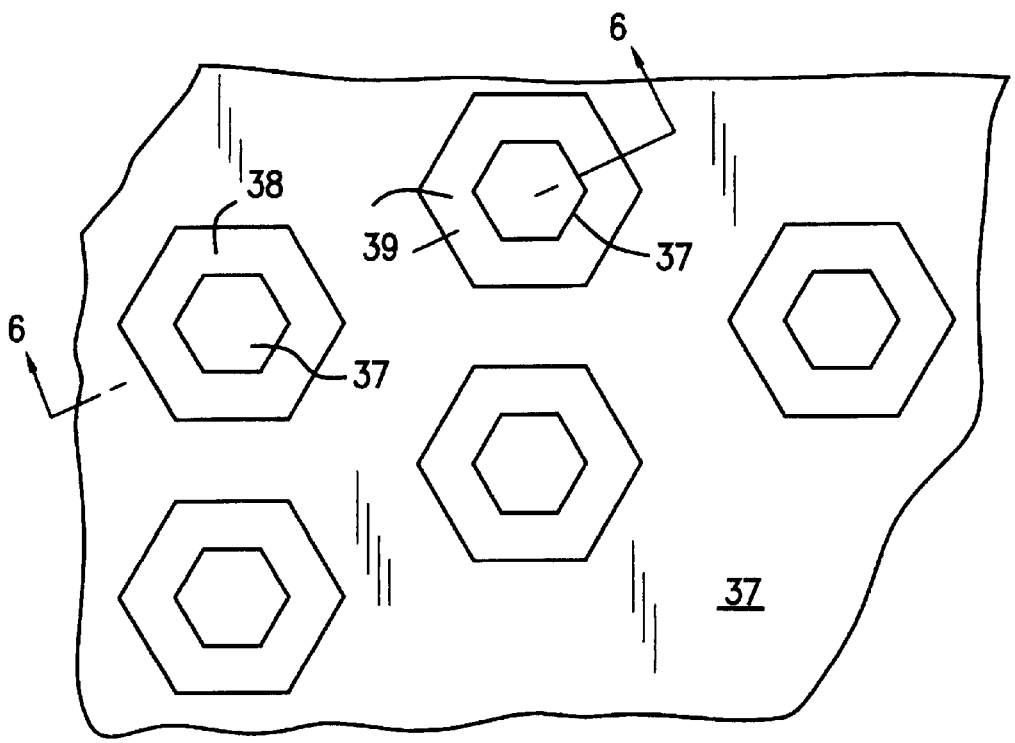
FIG. 5 is a plan view of the chip of FIG. 4 after a third mask operation in which an array of hexagonal openings are etched through the field oxide.
Figure 6:
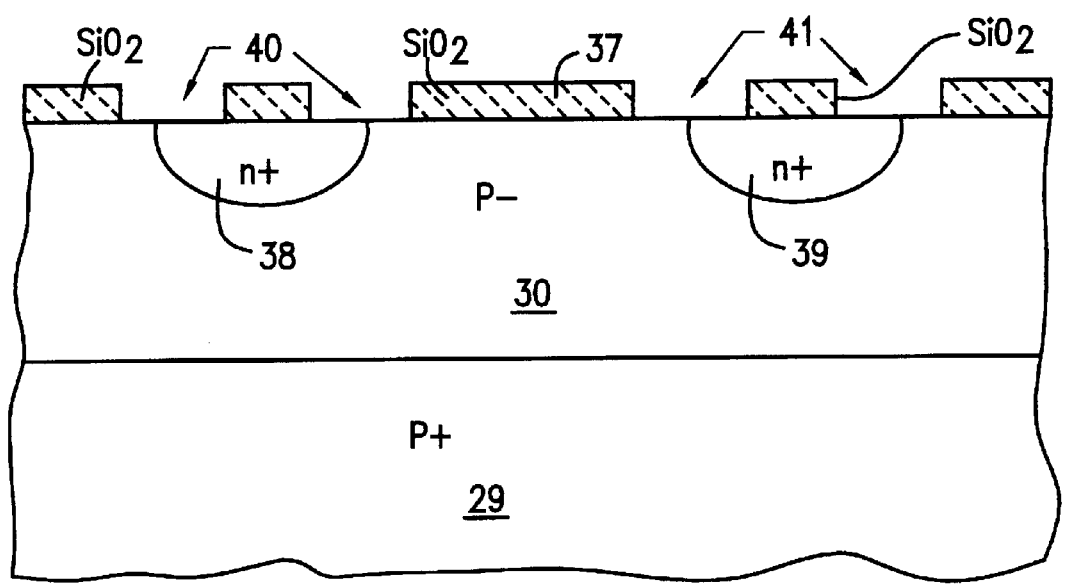
FIG. 6 is a cross-sectional view of FIG. 5 taken across section lines 6—6 in FIG. 5.

A third masking step is then carried out to form the geometry shown in FIGS. 5 and 6. More specifically, hexagonal openings 40 and 41 are etched in the silicon dioxide layer 37. The geometric pattern of a portion of the surface of the device region is shown in FIG. 5, and a cross-section of this pattern is shown in FIG. 6. Though hexagonal openings are shown, other geometric shapes are also possible.

The etched areas 40 and 41 serve as openings for subsequent channel and source implants which are shown in FIG. 7. Typically, a phosphorus ion implant step is carried out at a dose of roughly 5.5E13 to 8E13 and at an energy of about 100 KeV, for example. A screening oxide may be grown prior to the implant to protect the surface of the wafer. The phosphorus ions are then driven in to form regions 42 and 43 having a desired junction depth.

Then, boron ions are implanted through openings 40 and 41. The implant is typically carried out at an energy of about 50 KeV at a dose of approximately 3E15, for example, and is then driven in to form the P+ source regions 44 and 45 shown in FIG. 8.

Figure 9:
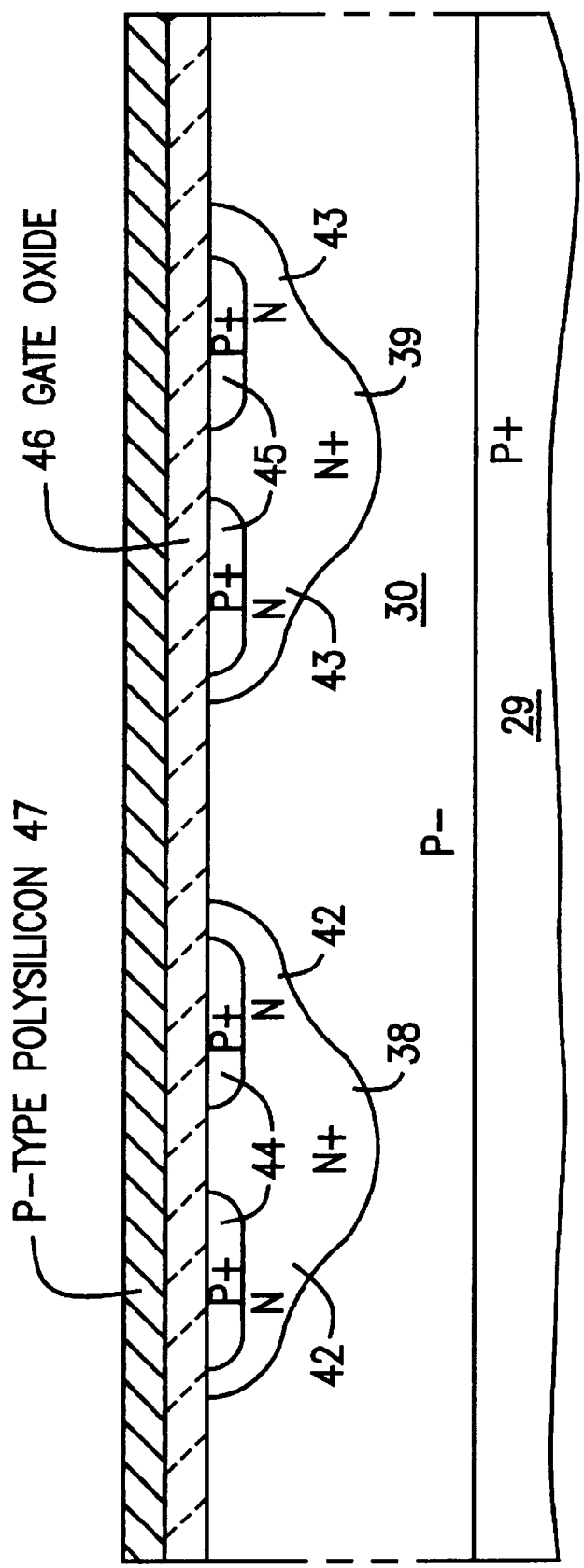
FIG. 9 shows the chip of FIG. 8 after a fourth masking step, the removal of oxide from all cell areas, and the deposition of a thin gate oxide layer and a polysilicon layer.

Thereafter, a fourth mask is formed which exposes the active areas of the wafer, and the oxide atop the active cell areas is removed so that oxide only remains atop the termination region as well as in the pad and gate bus areas (not shown). Then, a gate oxide layer 46 is grown atop the silicon substrate as shown in FIG. 9. A sacrificial oxide (not shown) may be grown in the active areas prior to the formation of the gate oxide and is removed shortly before the gate oxide formation step. The gate oxide layer may also be annealed after its formation.

The gate oxide layer 46 has a thickness of about 500–1000 Å. The gate oxide 46 may be somewhat thicker where it overlies the doped source regions because silicon oxide grows faster over the more heavily doped silicon. The thinnest oxide layer possible was previously grown, since the thinner oxides have a reduced total dose threshold shift in the presence of a radiation dose. However, by growing the gate oxide at the step of FIG. 9 in the manufacturing process, there is a substantial reduction of postoxidation thermal cycling at high temperature which would otherwise make the device more sensitive to radiation.

Following the formation of the gate oxide layer 46, a polysilicon layer 47 is formed over the device surface and, in accordance with another aspect of the invention, is heavily doped with boron. A blanket dose of boron is implanted into the polysilicon to form a layer of P-type polysilicon from which the gate electrode is subsequently formed, according to this aspect of the invention. The polysilicon is doped with about a 5E15 dose at an energy of roughly 50 KeV, for example. The polysilicon layer 47 is then covered by a very shallow oxide layer (not shown) which can have a thickness, for example, of about 500 Å and can serve as a mask for patterning the polysilicon layer 46 in a later step.

Figure 10:
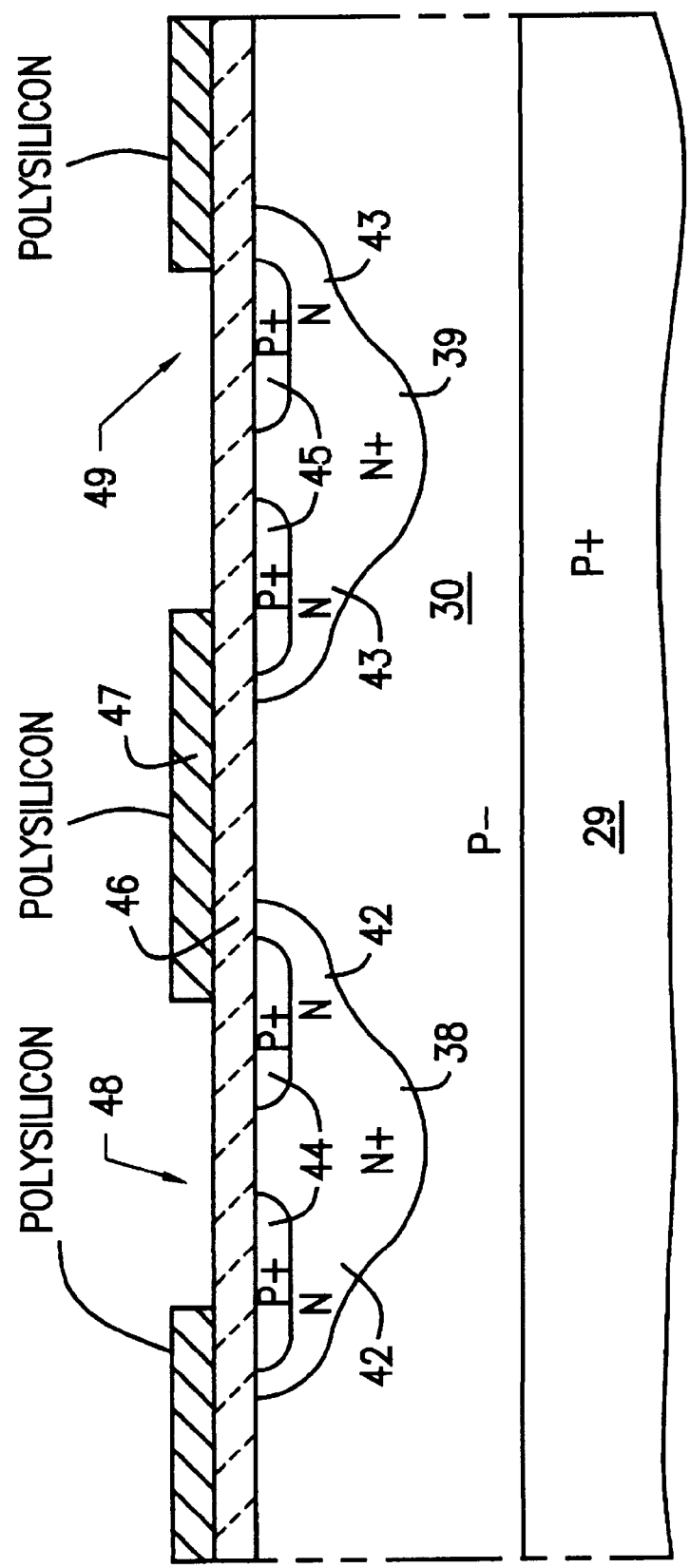
FIG. 10 shows the chip of FIG. 9 after a fifth mask step for patterning the polysilicon.

A fifth masking step then employs a mask to pattern the polysilicon to open hexagonal openings, such as openings 48 and 49 in FIG. 10, at the respective cell sites. The interior edges of the windows 48 and 49 slightly overlap the gate oxide coating over the source regions 46. Consequently, the polysilicon 47 is farther removed from the surface of the silicon 30 to reduce input capacitance.

Figure 11:
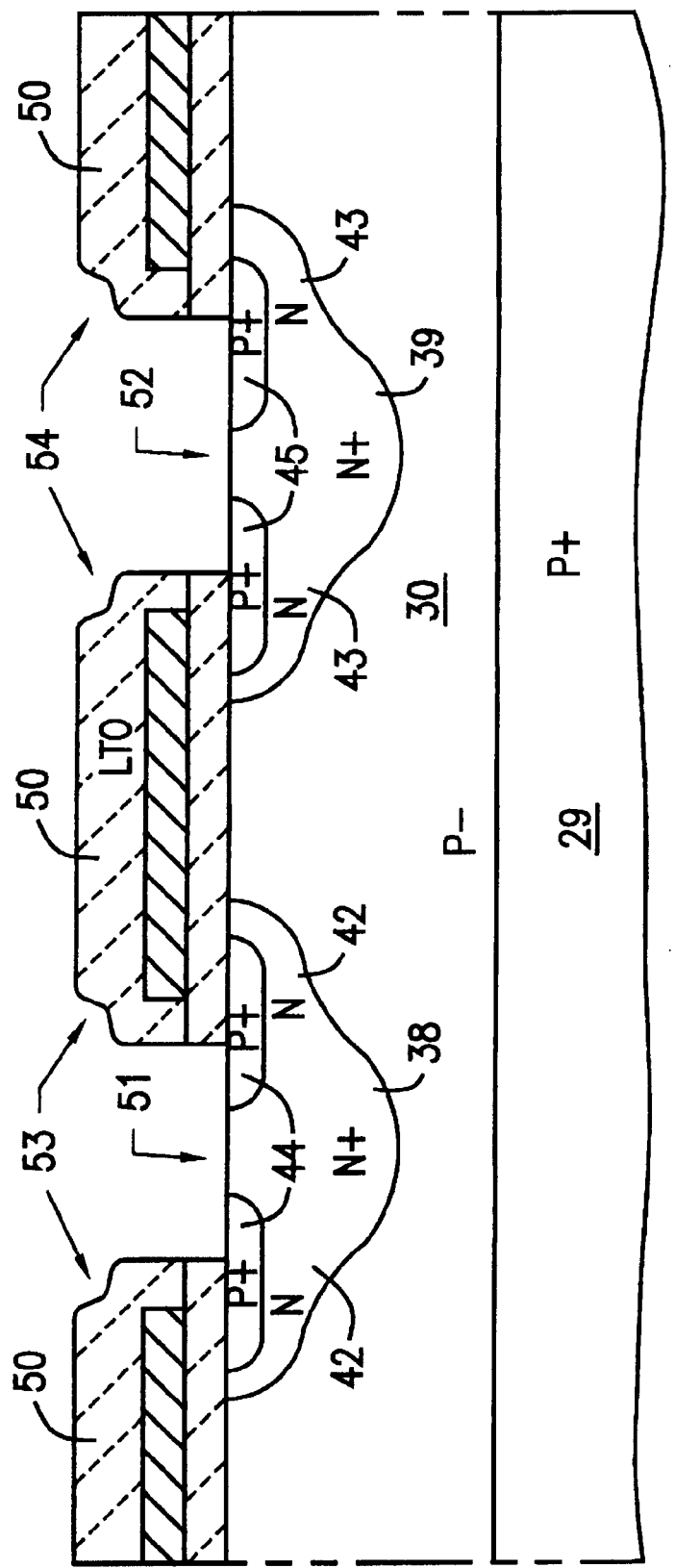
FIG. 11 shows the chip of FIG. 10 after the deposition of an LTO layer and after a sixth mask step in which windows are etched in the LTO layer.

Thereafter, an interlayer oxide 50, such as a 1 micron thick LTO layer is formed over the device surface, as shown in FIG. 11. The oxide layer 50 is then subjected to about 800° C. for about one hour to densify the interlayer oxide material. This reflow step does not adversely affect the properties of gate oxide 46.

The interlayer oxide 50 is then doped with approximately a 1E14 dose of arsenic ions at an energy of about 120 KeV, for example. The arsenic implant changes the etch rate of the doped portion of the interlayer oxide 50 so that during the subsequent etching steps, the oxide is etched to have tapered profiles 53 and 54 in the contact area. This tapered profile improves the step coverage of the subsequently deposited contact metal layer.

Figure 12:
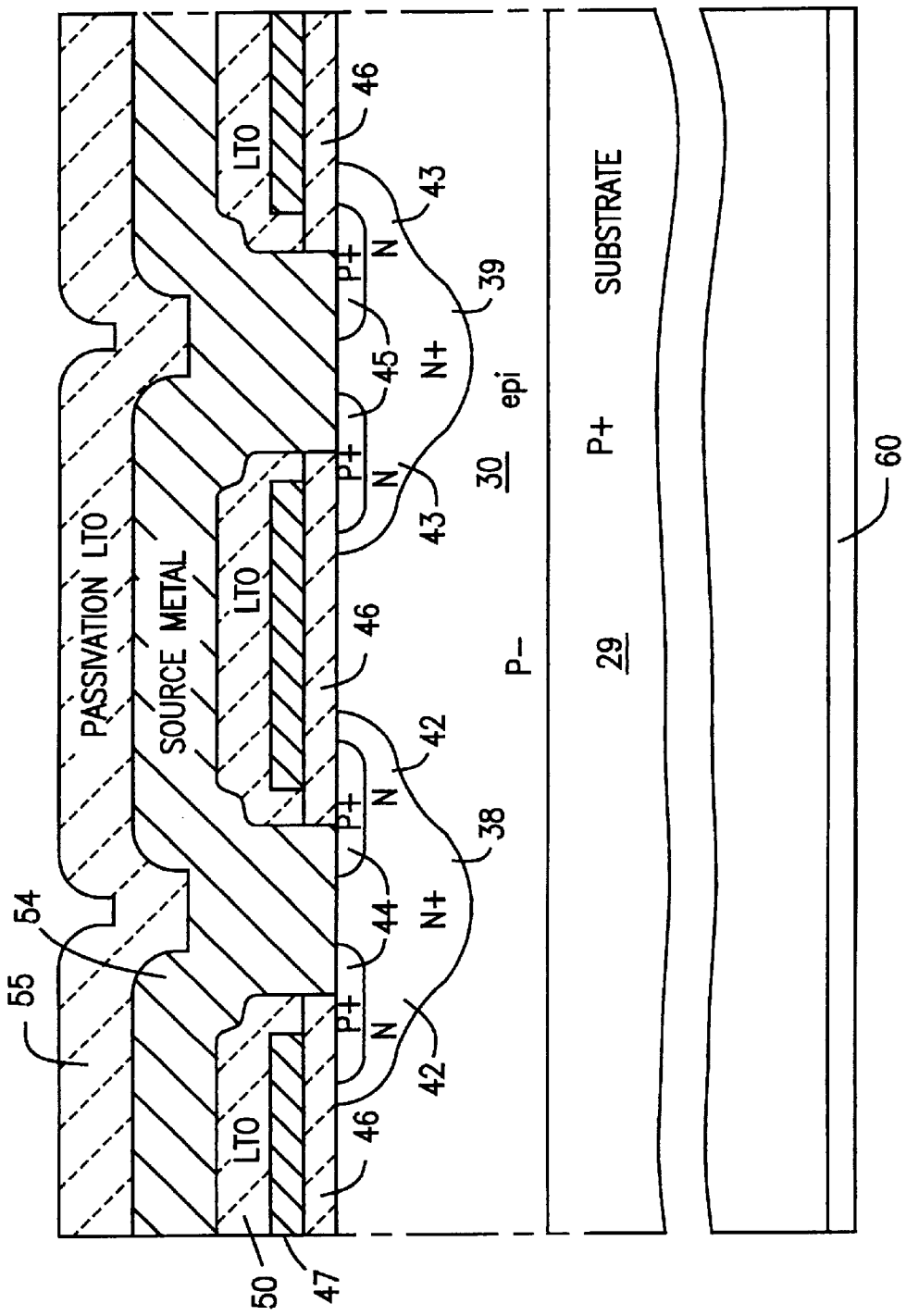
FIG. 12 shows the chip of FIG. 11 after an aluminum contact is deposited over the device surface and after surface passivation and backside metal layers are formed thereon.

Then, a sixth masking operation takes place in which mask openings are located over the center of the body regions 38, 39 to form openings for exposing the silicon for a contact deposition operation. A contact metal layer 54, such as aluminum, shown in FIG. 12, is then deposited over the surface and makes contact with the body regions as well as the source regions 44, 45.

Thereafter, conventional steps are carried out to complete the chip structure, including a seventh masking step and an etching operation which patterns the contact metal coating 54 to define and separate the source electrode from gate bus fingers as disclosed in U.S. Pat. No. 4,593,302, and to remove the contact metal from the termination regions. A scratch coating 55, which may be an LTO surface passivation layer, is then formed.

Then, an eighth masking operation is carried out to define a connection pad etch. A backside metal layer 60 that forms the drain electrode is then deposited.

In the manufacture of the device as described above, it will be apparent that a thin gate oxide 46 is not subjected to substantial thermal cycling, thereby being less sensitive to radiation damage. Indeed, the device exhibits a relatively flat curve of threshold gate-to-source voltage as a function of total radiation up to and exceeding 1 megarad.

In forming the gate oxide 46, the gate oxide can preferably be grown in one of several ways. It can be grown at 900° C. in wet steam without anneal, and can be grown in 975° C. or 1000° C. dry oxygen with no anneal. Both of these methods are known to produce enhanced radiation hardness. Other techniques which can be used are growing the oxide layer 60 at 900° C. in wet steam followed by an anneal at 900° C. in nitrogen. Alternatively, the oxide layer can be grown at 900° C. in wet steam with a dry oxygen gas anneal at 900° C. Both of these processes can enhance radiation hardness. Also the oxide layer can be grown in 975° C. or 1000° C. dry oxygen and annealed in nitrogen or forming gas. These processes can also enhance radiation hardness.

While the contact to the source electrode has been disclosed as an ohmic contact, it is also possible to use a Schottky contact in which the relatively high resistivity source region is directly connected to the aluminum metal. This produces a very inefficient, leaky Schottky contact, which will have an increased resistance and will produce good ballasting for the numerous parallel connected source regions of a given device.

The P-channel device of the invention is optimized to provide both SEE withstand capability as well as total irradiation dose protection. In the known radhard devices, such optimization requires significant trade offs between the total irradiation dose protection requirements, which call for thinner gate oxides and low channel doping, and protection against single event burnout, which favors thicker gate oxides and higher channel doping. By contrast and as shown below, the P-channel device of the present invention includes optimal oxide thicknesses for both total radiation dose resistance and SEE resistance.

To show the total radiation dose resistance and SEE resistance of the P-channel device, the following tests were performed:

Sample wafers were taken from three respective production lots that include −60V, −100V and −200V rated P-channel power devices that were manufactured according to the invention. In this example, the size of the devices were either 6.53×6.53 mm or size 6.53×9.14 mm. For total radiation dose testing, eight die were selected from each wafer, with four being tested under Vgs bias and four tested under Vds bias. For SEE testing, sample wafers were randomly selected from the wafers that passed total irradiation dose testing.

The sample devices were each mounted in a hermetic T0–3 package in which the die were attached using a soft solder. However, for SEE testing, the cap of the T0–3 package was removed to permit the beam to directly strike the die.

To determine their total radiation dose resistance, the devices were irradiated with gamma radiation using a cobalt-60 source in accordance with military specification MIL-STD-750, method 1019, condition A. The sample devices were each attached to a circuit board, and then either Vgs or Vds biased and exposed to the Co-60 source. The samples were irradiated at a dose rate between 50 to 2000 rads(si)/s with the cumulative total dose determined by the exposure time.

Figure 13A:
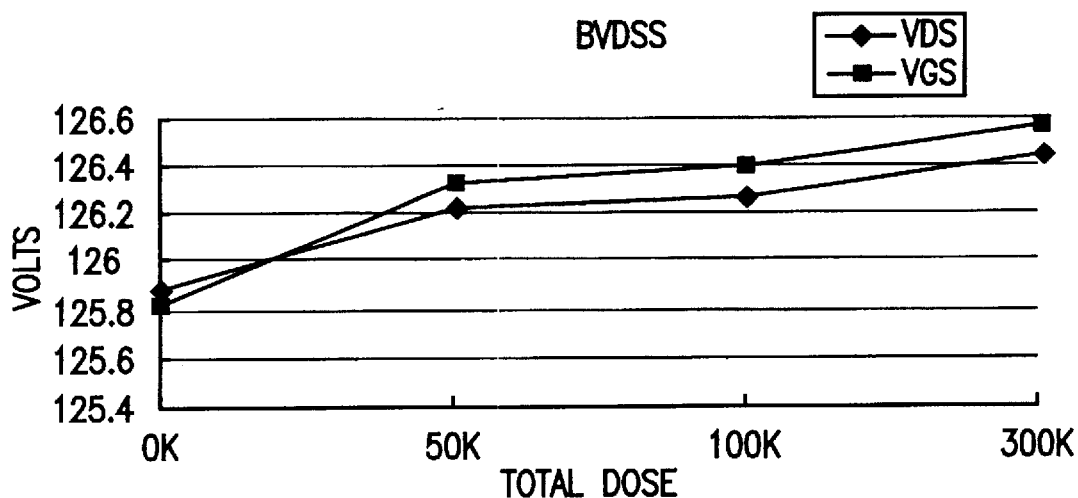
FIGS. 13A–13C show the typical device response of the device of the present invention as a function of total dose irradiation.
Figure 13B:
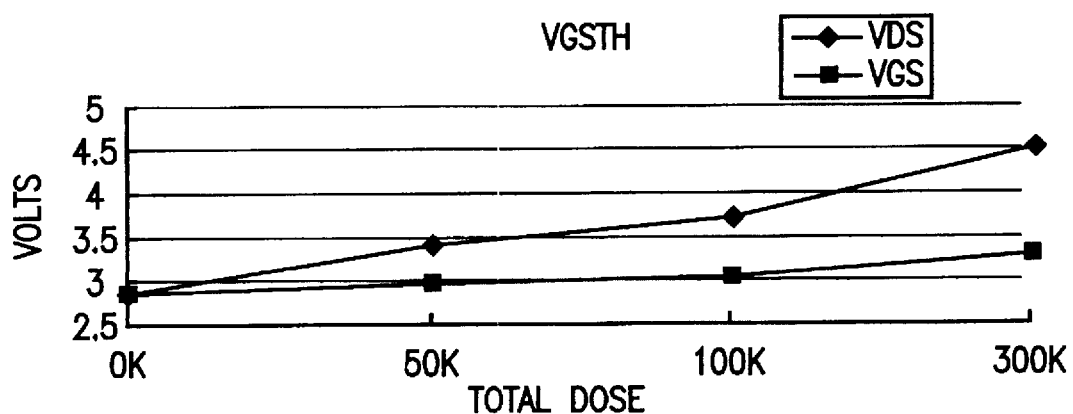
Figure 13C:
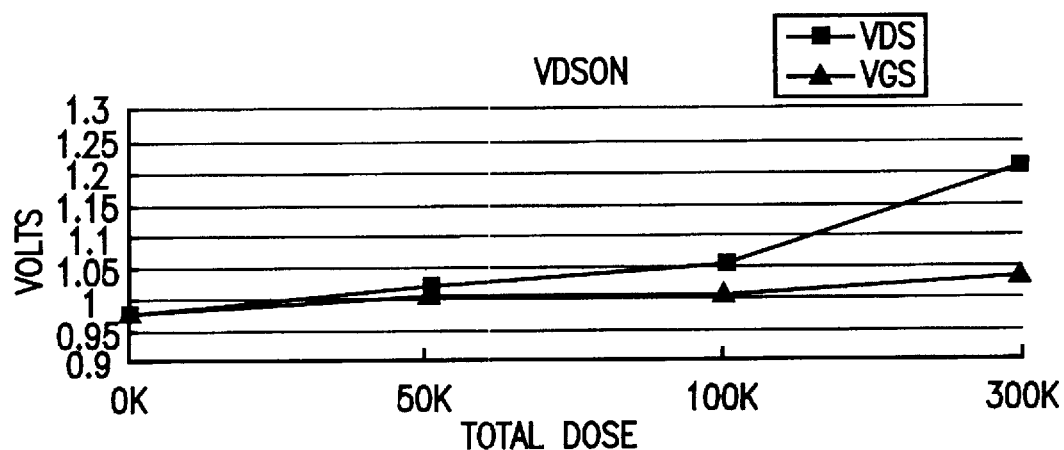

Following irradiation, the samples were removed from the radiation source and tested within one hour of removal for the BVDSS behavior, VGSTH behavior and VDSON behavior as a function of total radiation doses as shown in FIGS. 13A–13C, respectively. As shown, the devices were either tested under Vgs bias, in which the devices were shorted from drain to source and a potential of −12V applied from gate to source, or under Vds bias in which the samples were shorted from gate to source at a potential of 80% of the rated BVDSS applied from the drain to the source. As FIG. 13B shows, the threshold voltage changes by less than 1V over the range of doses from 0 to 300 Krad and remains well within the specified −5V limit even after receiving a dose of 300 Krad(Si).

The wafers were then tested for SEE resistance using the 88 inch diameter cyclotron at Lawrence Berkeley Laboratories to test for compliance with the Test Procedures for the Measurement of Single-Event Effects in Semiconductor Devices from Heavy Ion Irradiation EIA/JESD 57. The sample sizes used were those recommended by the Defense Supply Center in Columbus, Ohio using a recent publication of requirements for MOSFET device.

Figure 14:
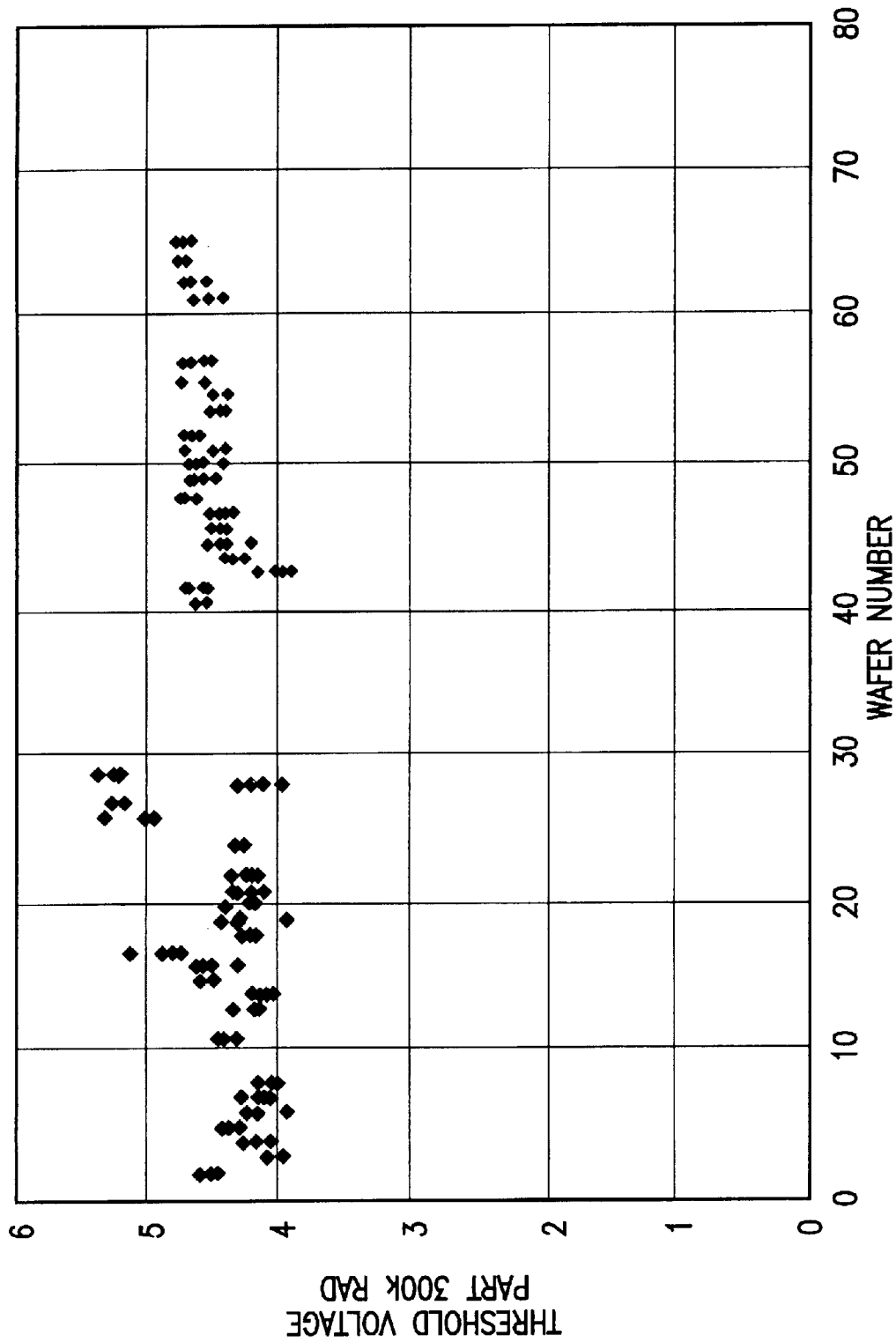
FIG. 14 is a diagram showing the threshold voltage of an example of the invention after receiving a 300 Krad irradiation dose.

Here, the caps of the TO–3 packages were removed, and the devices placed into a vacuum chamber. An ion beam was directed onto the die and covered the complete die surface. The samples were irradiated, one at a time, for a period determined by the ion flux and the desired fluence of the ion beam. In this example, the ion flux was limited to 1E4 ions/cm$^2$/s and the fluence was set at 5E5 ions. In this example, the samples were irradiated with krypton ions with an LET of 41 MeV/(mg/cm$^2$) at an energy of four hundred MeV. Devices of each high power type were tested at each combination of Vgs and Vds bias. The measured threshold voltages of each device are shown in FIG. 14. As shown, the threshold voltage remains with the −5V specification. Thus, the P- channel device of the invention is suitable for both total radiation dose environments as well as SEE environments, particularly for the more common applications where the P-channel device receives a positive gate voltage of no more than a few volts.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for the manufacture of a power MOSFET having improved total dose radiation resistance and resistance to single event failure, said method comprising the following steps performed sequentially:

introducing N-type dopants into an upper surface of a P-type substrate of a semiconductor wafer to form a plurality of spaced, N-type body regions;

introducing P-type dopants into said upper surface and within each of said body regions to form respective source regions, a periphery of each of said source regions being spaced from a periphery of its corresponding body region at said upper surface to define N-type channel regions therebetween;

forming a layer of gate insulation atop at least said channel region;

forming a polysilicon gate electrode atop said layer of gate insulation, said gate electrode also located above said channel region;

introducing P-type dopants into said polysilicon gate electrode so that said gate electrode has a P-type conductivity; and forming a source electrode atop of and connected to said source regions.

2. The process of claim 1 wherein the step of forming a layer of gate insulation atop at least said channel region comprises the step of forming a gate oxide layer atop said channel regions prior to forming said polysilicon gate electrode.

3. The process of claim 2 wherein said gate oxide is formed by a pyrogenic process.

4. The process of claim 2 further comprising a step of annealing said gate oxide after the formation thereof.

5. The process of claim 1 wherein said N-type channel regions are formed by an approximately 100 KeV phosphorus implant at a dose of about 5.5E13.

6. The process of claim 1 wherein said N-type channel regions are formed by an approximately 100 KeV phosphorus implant at a dose of about 8.0E13.

7. The process of claim 2 wherein said gate oxide has a thickness of about 500–1000 Å.

8. The process of claim 1 further comprising the step of forming an interlayer dielectric atop said gate electrode prior to forming said source electrode.

9. The process of claim 8 further comprising the step of forming openings to said source region and said body region in said interlayer dielectric.

10. The process of claim 9 further comprising the step of introducing dopants into said interlayer dielectric prior to forming said openings therein so that said openings have a tapered profile.

11. The process of claim 1 further comprising the step of forming a passivation layer atop said source electrode.

12. The process of claim 11 wherein said passivation layer is LTO.

13. The process of claim 1 wherein said gate electrode has a doping concentration corresponding to that of an approximately 50 KeV boron implant having a dose of about 5E15.

14. The process of claim 1 further comprising the steps of forming an oxide layer atop said P-type substrate and patterning and etching away portions of said oxide layer prior to introducing said N-type dopants.

15. The process of claim 14 further comprising the steps of patterning and removing further portions of said oxide layer and then introducing P-type enhancement dopants into said substrate.

16. The process of claim 15 further comprising the steps of forming a further oxide layer atop said substrate, patterning and etching away portions of said further oxide layer to form openings therein and then introducing further N-type dopants into said openings in said further oxide layer so that said base region includes a portion adjacent to said upper surface that is more heavily doped than another portion of said base region that is adjacent to a lower boundary between said base region and said substrate.

17. The process of claim 16 wherein said step of introducing P-type dopants includes introducing said P-type dopants into said openings in said further oxide layer.

18. The process of claim 1 further comprising the step of depositing a backside metal layer to a bottom surface of said silicon substrate.

* * * * *